(12) United States Patent
Campardo et al.

(10) Patent No.: US 9,805,810 B1
(45) Date of Patent: Oct. 31, 2017

(54) MEMORY DEVICE WITH PROGRESSIVE ROW READING AND RELATED READING METHOD

(71) Applicant: STMicroelectronics S.r.l., Agrate Brianza (IT)

(72) Inventors: Giovanni Campardo, Bergamo (IT); Salvatore Polizzi, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/387,397

(22) Filed: Dec. 21, 2016

(30) Foreign Application Priority Data

May 31, 2016 (IT) .................. 102016000056424

(51) Int. Cl.
| | | |
|---|---|---|
| G11C 7/00 | (2006.01) | |
| G11C 16/28 | (2006.01) | |
| G11C 16/24 | (2006.01) | |
| G11C 16/08 | (2006.01) | |

(52) U.S. Cl.
CPC .............. *G11C 16/28* (2013.01); *G11C 16/08* (2013.01); *G11C 16/24* (2013.01)

(58) Field of Classification Search
USPC ................... 365/203, 210.1, 210.11, 189.15
See application file for complete search history.

(56) References Cited

U.S. PATENT DOCUMENTS

| | | | | |
|---|---|---|---|---|
| 6,088,279 | A * | 7/2000 | Ishii ..................... | G11C 7/1051 365/210.1 |
| 2003/0086304 | A1 | 5/2003 | Park | |
| 2007/0127302 | A1* | 6/2007 | Okamoto ............... | G11C 17/12 365/233.11 |
| 2009/0040846 | A1* | 2/2009 | Chang ..................... | G11C 7/22 365/194 |
| 2010/0290295 | A1 | 11/2010 | Moriwaki | |
| 2011/0158029 | A1 | 6/2011 | Sasaki | |

\* cited by examiner

*Primary Examiner* — Vu Le
(74) *Attorney, Agent, or Firm* — Slater Matsil, LLP (57) ABSTRACT

A memory device includes a memory array with memory cells arranged in rows and columns and with word lines and bit lines. A dummy structure includes a dummy row of dummy cells and a dummy word line. A first pre-charging stage biases a word line of the memory array. An output stage includes a plurality of sense amplifiers. Each sense amplifier generates a corresponding output signal representing a datum stored in a corresponding memory cell precharged by the first pre-charging stage. A second pre-charging stage biases the dummy word line simultaneously with the word line biased by the first pre-charging stage. The output stage includes an enable stage, which detects a state of complete pre-charging of an intermediate dummy cell.

20 Claims, 4 Drawing Sheets

MEMORY DEVICE WITH PROGRESSIVE ROW READING AND RELATED READING METHOD

CROSS-REFERENCE TO RELATED APPLICATIONS

This application claims priority to Italian Patent Application No. 102016000056424, filed on May 31, 2016, which application is hereby incorporated herein by reference.

TECHNICAL FIELD

The present invention relates to a memory device in which a progressive row reading is implemented. Moreover, the present invention regards a method for reading a memory device.

BACKGROUND

Figure 1:
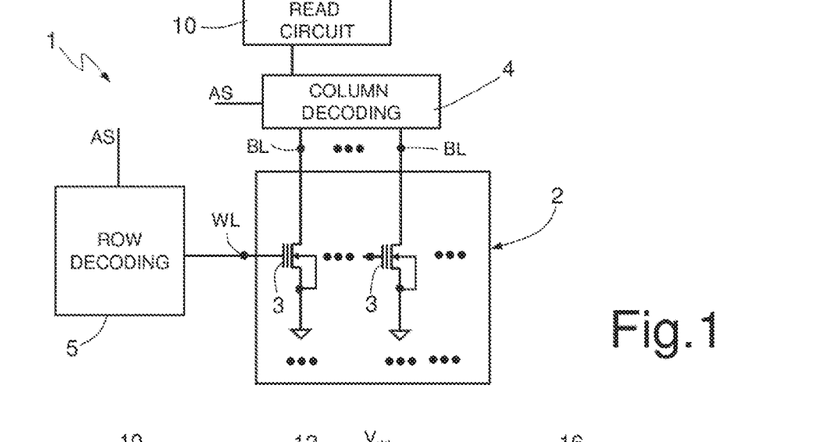
FIG. 1 shows a general block diagram of a memory device of a known type.

As shown schematically in FIG. 1, a memory device 1 of a known type, for example, of a non-volatile flash type, comprises a memory array 2 including a plurality of memory cells 3, which are arranged in rows and columns. Each row is coupled to a corresponding word line WL, whereas each column is coupled to a corresponding bit line BL.

Each memory cell 3 is formed by a storage element, which is formed by a floating-gate transistor. The gate terminal of the floating-gate transistor is coupled to a respective word line WL, whereas a first conduction terminal is coupled to a respective bit line BL; in addition, a second conduction terminal of the floating-gate transistor is connected to a reference potential (for example, a ground). The gate terminals of the memory cells 3 of a same row are thus connected to a same word line WL; moreover, the first conduction terminals of the memory cells 3 of a same column are connected to a same bit line BL.

A column-decoder circuit 4 and a row-decoder circuit 5 enable selection, on the basis of address signals received at input (designated as a whole by AS), of the memory cells 3, and in particular of the corresponding word lines WL and bit lines BL each time addressed, enabling biasing thereof at appropriate voltage and current values during the memory operations. In this connection, albeit not shown in detail in FIG. 1, both the column-decoder circuit 4 and the row-decoder circuit 5 are coupled to an address bus and are moreover provided with corresponding enable inputs, through which the circuits are notified of the fact that on the address bus a new address is present. The addresses and the signals for the enable inputs of the column-decoder circuit 4 and of the row-decoder circuit 5 are generated by a purposely provided circuitry (not shown).

The column-decoder circuit 4 provides a read path, which forms conductive paths between the bit line BL of the memory array 2 each time selected and a read-amplifier circuit 10. In turn, the read-amplifier circuit 10 is designed to compare the current circulating in each memory cell 3 addressed with a reference current in order to determine the corresponding data item stored.

Figure 2:
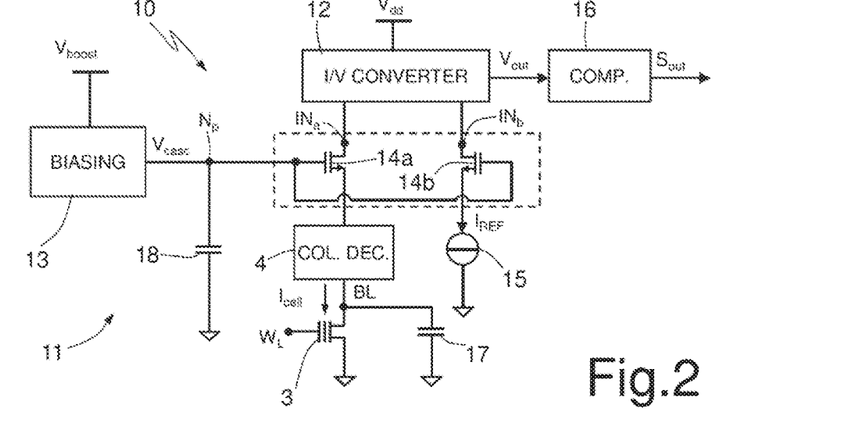
FIG. 2 shows a block diagram of a read-amplifier circuit of the memory device shown in FIG. 1, which is also of a known type.

As shown in FIG. 2, the read-amplifier circuit 10 comprises a biasing stage 11, designed to bias the bit lines BL of the memory array 2, and a current-to-voltage (I/V) converter stage 12, which are now described limitedly to the functions that they perform in regard to a bit line BL of the memory array 2, and thus limitedly to the portions that co-operate with the bit line BL of the memory array 2, on the hypothesis of the bit line BL having been addressed, i.e., selected.

The biasing stage 11 in turn comprises a biasing generator 13 and a pair of biasing transistors 14a, 14b, of an NMOS type in cascode configuration.

The biasing generator 13 receives at input a voltage that may be boosted (in what follows referred to as "boosted voltage $V_{boost}$"), for example by a charge-pump voltage-booster stage (not shown), and generates at output a biasing voltage $V_{casc}$ on a biasing node $N_p$. Alternatively, and according to the value that it is desired to obtain for the biasing voltage $V_{casc}$, the biasing generator 13 may receive directly a supply voltage $V_{dd}$, of a value lower than that of the boosted voltage $V_{boost}$.

The control terminals of the biasing transistors 14a, 14b are both connected to the aforesaid biasing node $N_p$ so as to receive the biasing voltage $V_{casc}$.

Moreover, a first biasing transistor 14a of the pair has a first conduction terminal coupled to the bit line BL, from which it receives a cell-reading current $I_{cell}$, through the read path formed by the column-decoder circuit 4; moreover, the first biasing transistor 14a comprises a second conduction terminal, which is connected to a first comparison input $IN_a$ of the current-to-voltage converter stage 12.

The second biasing transistor 14b of the pair has a respective first conduction terminal coupled to a current-reference generator 15 (or, alternatively, to a reference cell, here not illustrated), from which it receives a reference reading current $I_{ref}$, and a second conduction terminal, which is connected to a second comparison input $IN_b$ of the current-to-voltage converter stage 12.

The current-to-voltage converter stage 12 moreover has a supply input, on which it receives the supply voltage $V_{dd}$, and is configured to make a comparison between the value of the cell-reading current $I_{cell}$ and the value of the reference reading current $I_{ref}$, as well as for generating, on the basis of the result of this comparison, an output voltage $V_{out}$. The cell-reading current $I_{cell}$ traverses the memory cell 3 actually addressed, but not the other memory cells 3 coupled to the bit line BL, and is a function of the data item stored therein.

The read-amplifier circuit 10 further comprises a comparator stage 16, which receives at input the output voltage $V_{out}$ from the current-to-voltage converter stage 12 and generates, on the basis of the value (for example, positive or negative) of this output voltage $V_{out}$, a digital reading signal $S_{out}$ representing the data item stored in the memory cell 3 addressed.

In practice, the read-amplifier circuit 10 forms, for each bit line BL, a corresponding sense amplifier designed to generate, as a function of the corresponding cell-reading current $I_{cell}$, the digital reading signal $S_{out}$.

FIG. 2 moreover shows a parasitic line capacitor 17, electrically coupled between the bit line BL and a ground reference, and a biasing capacitor 18, coupled between the biasing node $N_p$ and the ground reference itself.

This being said, the operation of reading of data items stored in the memory cells 3 envisages a first step of pre-charging of the corresponding bit lines BL. For example, in the case where, out of the bit lines BL, the bit line BL shown in FIG. 2 has been addressed, the biasing stage 11 and the first biasing transistor 14a carry out pre-charging of the bit line BL. More in particular, the first biasing transistor 14a enables application to the bit line BL shown in FIG. 2 of a desired pre-charging voltage, as a function of the biasing voltage $V_{casc}$ (in particular, this pre-charging operation enables charging of the parasitic capacitance 17).

The reading operation then envisages sensing of the cell-reading current $I_{cell}$ and its comparison with the reference reading current $I_{ref}$ in order to generate the output voltage $V_{out}$ and, via the comparator stage 16, the digital output signal $S_{out}$. The cell-reading current $I_{cell}$ flows in the memory cell 3 coupled to the bit line BL shown in FIG. 2 and addressed, i.e., selected, via pre-charging, by the row-decoder circuit 5, of the corresponding word line WL. In this connection, from the standpoint of each word line WL, the behaviour of the row-decoder circuit 5 is comparable to that of a so-called inverter. Moreover, to select a word line WL, the row-decoder circuit 5 pre-charges (i.e., biases) the word line WL at a voltage such that the floating-gate transistor of a memory cell 3 coupled to the word line WL and to a bit line BL selected is in conduction. Instead, given a non-selected word line WL, the floating-gate transistors coupled thereto are inhibited.

As mentioned previously, the aforesaid cell-reading current $I_{cell}$ depends upon the data item stored in the memory cell 3 selected; consequently, the digital output signal $S_{out}$ represents this stored data item.

For example, in the case where the cell-reading current $I_{cell}$ is greater than the reference reading current $I_{ref}$, the digital output signal $S_{out}$ may assume a high logic value (I), whereas the digital output signal $S_{out}$ may assume a low logic value ('o') in the case where the cell-reading current $I_{cell}$ is lower than the reference reading current $I_{ref}$.

This being said, between presentation of a read command, i.e., (to a first approximation) generation of a new address and enabling of the column-decoder circuit 4 and of the row-decoder circuit 5, and generation of the corresponding digital output signals $S_{out}$ (for example, on an output bus, not shown, and on the simplifying hypothesis that the delay introduced by the reading circuitry is zero) a period of time elapses known as "initial latency". During the initial latency, the digital output signals $S_{out}$ are not stable.

In greater detail, current memory devices are characterized by initial latencies that typically fall in the range between some tens of nanoseconds and some hundreds of microseconds. Values close to the lower limit of the aforementioned range are achieved by "embedded" memory devices, i.e., by memory devices integrated for example in microcontrollers. In these memory devices, it is possible to implement a high reading parallelism, thanks to the fact that it is not necessary to send the data items on an external bus of a predefined size (typically, sixteen bits). Instead, in the case of stand-alone memory devices, i.e., memory devices that may be interfaced with the outside world and are provided with a high number of columns (for example, tens of thousands of cells per row) the initial latency typically assumes values close to the upper limit of the aforementioned range.

In practice, today the initial latency represents one of the main causes that limit increase of dimensions of stand-alone memory devices. Moreover, in the case of embedded memory devices, the initial latency represents a lower limit for the so-called access time. For these reasons, irrespective of the type of memory device, there is felt the need to reduce the initial latency.

SUMMARY

Embodiments of the present invention can solve, at least in part, the problems highlighted previously by providing a memory device having a reduced initial latency.

According to the present invention, a memory device and a reading method are provided, as defined in the annexed claims.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

The present memory device and the present reading method stem from an observation made by the present Applicant, who has noted how, when a row of a memory device is selected, the corresponding memory cells are not pre-charged simultaneously, on account of inevitable propagation delays.

In greater detail, with reference for example to a memory device of a flash type such as the one shown in FIGS. 1 and 2, each word line WL is formed by the gate terminals of the memory cells 3 coupled thereto and is typically provided with a metal layer having a high resistance. Moreover, the gate terminals of the floating-gate transistors form a system of capacitors connected to the word line WL. Consequently, each word line WL may be considered equivalent to a series of RC elements. For these reasons, the gate terminals of the floating-gate transistors of the memory cells 3 coupled to a word line WL selected are charged in times that increase the greater their distance from the row-decoder circuit 5.

Figure 3:
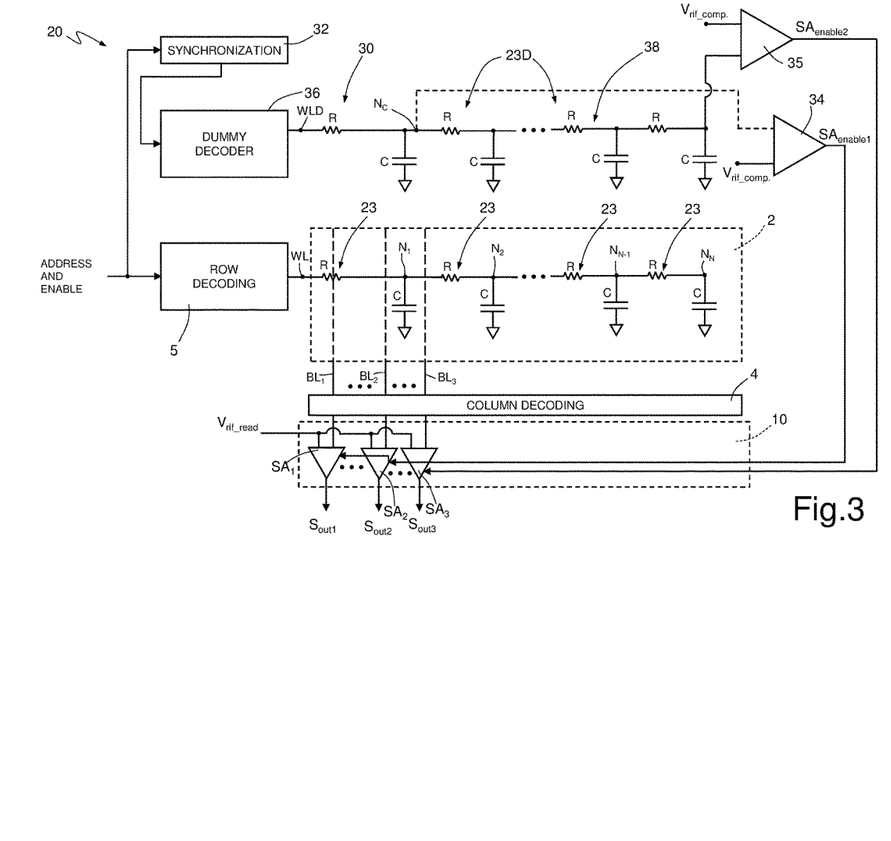
FIGS. 3, 5, and 6 show general block diagrams of memory devices, pails of these devices being shown in terms of equivalent electrical circuits.

This being said, a first embodiment of the present memory device is now described in detail, with reference to FIG. 3, where the present memory device is designated by 20, and where components already present in the device shown in FIGS. 1 and 2 are designated by the same terms and references, except where otherwise specified.

Without any loss of generality, the memory device 20 is thus of a non-volatile flash type. Moreover, in what follows the memory device 20 is described with reference to the differences with respect to the device shown in FIGS. 1 and 2. In addition, in FIG. 3 the memory cells 3 are represented with equivalent electrical models.

More in particular, in FIG. 3 the memory cells 3 coupled to each word line WL (only one of which is shown in FIG. 3) are grouped in sets of cells 23, each of which is formed by a same number of memory cells 3 arranged in sequence. Without any loss of generality, the sets of cells 23 have a same value of resistance and a same value of capacitance. In addition, each set of cells 23 is represented by a resistor R and by a capacitor C. In particular, given a set of cells 23, a first terminal of the respective resistor R is designed to be connected to the second terminal of the resistor R of the previous set of cells, whereas a second terminal of the respective resistor R is designed to be connected to a first terminal of the respective capacitor C, the second terminal of which is connected to ground.

By way of example, appearing in FIG. 3 are a first internal node, a second internal node, an (N−1)-th internal node, and an N-th internal node, which are designated, respectively, by $N_1$, $N_2$, $N_{N-1}$, and $N_N$. The first internal node $N_1$ and the N-th internal node $N_N$ are, respectively, the node that is closest to and the node that is furthest away from the row-decoder circuit 5. Once again without any loss of generality, it is, for example, possible to have N=200 and thus each set of cells 23 is formed by two hundred memory cells 3, which are such that the resistance of the resistor R and the capacitance of the capacitor C are 50 kΩ and 4 pF, respectively. In this case, considering the high number of memory cells 3 coupled to each word line WL, the memory device 20 forms a so-called memory of a stand-alone type.

Figure 4:
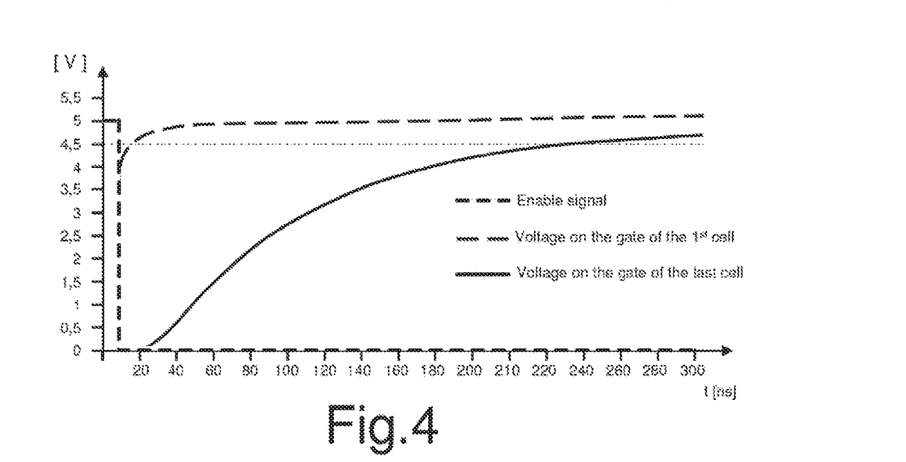
FIG. 4 shows time plots of electrical quantities generated in the memory device shown in FIG. 3.

This being said, FIG. 4 shows, in addition to an enable signal present at input to the row-decoder circuit 5, the plots of the voltages present on the gate terminals of the floating-gate transistors of two memory cells 3 that are coupled to a same word line WL and that are, respectively, the one closest to and the one furthest away from the row-decoder circuit 5. In other words, FIG. 4 shows the plot of the voltage of the gate terminal closest to the row-decoder circuit 5, as well as the plot of the voltage of the N-th internal node $N_N$, i.e., the plot of the voltage of the gate terminal furthest away from the row-decoder circuit 5.

Once again with reference to FIG. 4, it is assumed therein that the supply voltage $V_{dd}$ is 5 V. In addition, it is assumed that a memory cell 3 is correctly pre-charged by the row-decoder circuit 5 when the gate terminal of its floating-gate transistor has reached 4.5 V. This being said, it is found that the memory cell 3 closest to the row-decoder circuit 5 is pre-charged approximately 5 ns after the aforementioned enable signal has enabled the row-decoder circuit 5, causing application to the word line WL, by the row-decoder circuit 5 itself, of a row-biasing voltage. The memory cell 3 furthest away from the row-decoder circuit 5 is, instead, pre-charged after approximately 220 ns. This being said, as described in detail hereinafter, in the present memory device 20 reading is carried out without waiting 220 ns, i.e., without waiting for all the memory cells 3 of the word line WL to be pre-charged.

Once again with reference to FIG. 3, for simplicity of representation it shows just a first bit line, a second bit line, and a third bit line, designated by $BL_1$, $BL_2$, and $BL_3$, respectively, the positions of which with respect to the series of RC elements that form the word line WL shown in FIG. 3 are purely indicative, since, as has been said, each set of cells 23 comprises a high number of memory cells and is represented only as equivalent electrical circuit. In this connection, with reference to the word line WL shown in FIG. 3, the first and second bit lines $BL_1$, $BL_2$ are coupled to the first set of cells 23, i.e., to the set of cells 23 closest to the row-decoder circuit 5, the second bit line $BL_2$ being set at a greater distance from the latter than the first bit line $BL_1$; the third bit line is, instead, coupled to the second set of cells 23. Coupling between the first, second, and third bit lines $BL_1$, $BL_2$, and $BL_3$ and the corresponding sets of cells 23 occurs in a per se known manner and is shown only qualitatively in FIG. 3, where the portions of the first, second, and third bit lines $BL_1$, $BL_2$, $BL_3$ within the memory array 2 are represented dashed, to indicate that they are purely qualitative. In practice, since each set of cells 23 includes a number N of memory cells 3, FIG. 3 does not indicate precisely to which memory cells 3 of the word line WL the first, second, and third bit lines $BL_1$, $BL_2$, $BL_3$ are coupled, but rather merely provides, in this connection, qualitative information. In particular, FIG. 3 highlights how, with reference to the single row of the memory array 2 shown, the first and second bit lines $BL_1$, $BL_2$ are coupled to memory cells 3 belonging to the first set of cells 23, whereas the third bit line $BL_3$ is coupled to a memory cell 3 belonging to the second set of cells 23.

As regards the read-amplifier circuit 10, it is represented in order to highlight the presence of a first sense amplifier $SA_1$, a second sense amplifier $SA_2$, and a third sense amplifier $SA_3$, which receive at input a reading reference voltage $V_{rif\_read}$ and may be coupled, respectively, through the column-decoder circuit 4, to the first, second, and third bit lines $BL_1$, $BL_2$, $BL_3$. Further reference amplifiers, which may be coupled to the other bit lines (not shown) of the memory array 2, are not represented.

In a per se known manner, the first and second sense amplifiers $SA_1$, $SA_2$ are provided with respective enable inputs designed to receive a first sense-enable signal $SA_{enable1}$, which has the purpose of enabling/disabling operation of these sense amplifiers. In turn, the third sense amplifier $SA_3$ is provided with a respective enable input designed to receive a second sense-enable signal $SA_{enable2}$, which has the purpose of enabling/disabling operation of this sense amplifier. Moreover, when enabled, the first, second, and third sense amplifiers $SA_1$, $SA_2$, $SA_3$ are designed to generate, respectively, a first digital reading signal $S_{out1}$, a second digital reading signal $S_{out2}$, and a third digital reading signal $S_{out3}$.

As shown once again in FIG. 3, the memory device 20 further comprises a dummy structure 30, a synchronisation circuit 32, and a first comparison circuit 34 and a second comparison circuit 35. In turn, the dummy structure 30 comprises a dummy decoder 36 and a dummy row 38.

In detail, the dummy row 38 is the same as one of the rows (which are the same as one another) of the memory array 2, and is thus formed by memory cells 3, which will be referred to in what follows also as "dummy memory cells". Moreover, the dummy structure 30 comprises a respective dummy word line WLD. The dummy memory cells are coupled to the dummy word line WLD and to corresponding bit lines BL of the memory array 2 (the latter connections are not visible in FIG. 3). In this regard, FIG. 3 shows the equivalent circuit models of sets of dummy cells 23D, these sets being the same as the sets of cells 23 of the memory array 2.

The dummy decoder 36 is designed to select, i.e., to pre-charge, the dummy row 38. Moreover, the dummy decoder 36 simulates the behaviour of the row-decoder circuit 5; consequently, the dummy decoder 36 is, for example, the same as the row-decoder circuit 5.

In greater detail, the dummy decoder 36 is driven by the synchronisation circuit 32, which in turn receives at input the same signals as the ones that are received at input by the row-decoder circuit 5, so that the synchronisation circuit 32 is designed to detect the presence of a new address, as well as start of a new read cycle.

In use, at each read cycle the synchronisation circuit 32 drives the dummy decoder 36 so that the row-decoder circuit 5 and the dummy decoder 36 pre-charge simultaneously, respectively, the row to be read of the memory array 2 and the dummy row 38. In other words, the row-decoder circuit 5 and the dummy decoder 36 apply simultaneously a same row-biasing voltage to the word line WL of the row to be read of the memory array 2 and to the dummy word line WLD, respectively. Since the dummy word line WLD is the same as the word line WL of the memory array 2, the evolution in time of the voltage along the dummy word line WLD is the same as the evolution of the voltage along the word line WL of the row to be read.

The first comparison circuit 34 has a first input set at a comparison reference voltage $V_{rif\_comp}$; moreover, the first comparison circuit 34 has a second input, which is connected to a gate terminal of one of the floating-gate transistors that forms one of the dummy memory cells, which will be referred to in what follows as "comparison node $N_c$". For the reasons explained previously, and thus on account of the electrical model adopted for the sets of dummy cells 23D, in FIG. 3 the position of the comparison node $N_c$ is purely qualitative and may not be identified with the corresponding electrical node shown in FIG. 3. For this reason, the connection between the comparison node $N_c$ and the first comparison circuit 34 is represented dashed.

As regards the position of the comparison node $N_c$ along the dummy row 38, it separates the dummy row 38 into a first portion, connected to the dummy decoder 36, and a second portion, set downstream of the first portion. Likewise, each row of the memory array 2 may be viewed as being made up of a respective first portion, that is the same as the first portion of the dummy row 38, and a respective second portion, that is the same as the second portion of the dummy row 38. In addition, the row-decoder circuit 5 and the first and second portions of each row of the memory array 2 have the same mutual arrangement as the dummy decoder 36 and the first and second portions of the dummy row 38.

From yet another point of view, in each word line WL of the memory array 2 there exists a gate terminal of one of the floating-gate transistors that forms a node (not shown) arranged, within the corresponding row of the memory array 2, in the same position as that assumed by the comparison node $N_c$ within the dummy row 38. In what follows, this node will be referred to as "equivalent node". The first portion of each row of the memory array 2 includes, as last cell, the memory cell that forms the respective equivalent node.

In yet other words, the comparison node $N_c$ is formed by a dummy cell having a given position, different from the last position, within the dummy row 38. The first portion of each row of the memory array 2 includes the memory cells 3 that have, within the respective row, positions comprised between the first position and the position itself of the dummy cell that forms the comparison node N. The second portion of each row of the memory array 2 includes, instead, the memory cells 3 that have, within the respective row, positions comprised between the position subsequent to the position of the dummy cell that forms the comparison node $N_c$ and the last position.

On the basis of what has been said previously, the evolution of the voltage of each equivalent node follows that of the voltage on the comparison node N. Purely by way of example, in the embodiment shown in FIG. 3, the first and second bit lines $BL_1$, $BL_2$ are arranged upstream of the equivalent nodes of the rows of the memory array 2; i.e., they are coupled to memory cells 3 that are arranged, for each row, closer to the row-decoder circuit 5 than the memory cell 3 the floating-gate transistor of which forms the corresponding equivalent node. The third bit line $BL_3$ is arranged downstream of the equivalent nodes of the rows of the memory array 2.

The comparison reference voltage $V_{rif\_comp}$ is equal to the value of voltage that enables correct pre-charging of the memory cells 3, i.e., for enabling reading thereof. For example, with reference to FIG. 4, the comparison reference voltage $V_{rif\_comp}$ is 4.5 Volt.

The comparison circuit 34 generates the aforementioned first sense-enable signal $SA_{enable1}$ as a function of the comparison reference voltage $V_{rif\_comp}$ and of the voltage of the comparison node $N_c$ so that the first sense-enable signal $SA_{enable1}$ represents the relation existing between these two signals.

As mentioned previously, the first sense-enable signal $SA_{enable1}$ is supplied on the enable inputs of the first and second sense amplifiers $SA_1$, $SA_2$, and more in general on the enable inputs of the sense amplifiers that may be coupled to bit lines arranged upstream with respect to the equivalent nodes, or else to the bit line coupled to the equivalent nodes.

In detail, the first comparison circuit 34 detects overstepping, by the voltage of the comparison node $N_c$, of the comparison reference voltage $V_{rif\_comp}$.

In greater detail, the first comparison circuit 34 generates the first sense-enable signal $SA_{enable1}$ so that, when the voltage of the comparison node $N_c$ exceeds the comparison reference voltage $V_{rif\_comp}$, the first sense-enable signal $SA_{enable1}$ enables operation of the sense amplifiers that may be coupled to bit lines coupled to the first portions of the rows of the memory array 2. For example, with reference to just the first, second, and third sense amplifiers $SA_1$, $SA_2$, $SA_3$, when the voltage of the comparison node $N_c$ exceeds the comparison reference voltage $V_{rif\_comp}$, just the first and second sense amplifiers $SA_1$, $SA_2$ are enabled.

The sense amplifiers that may be coupled to bit lines coupled to the second portions of the rows of the memory array 2 are, instead, enabled subsequently, as described in what follows.

In detail, as mentioned previously, the second sense-enable signal $SA_{enable2}$ is supplied on the enable input of the third sense amplifier $SA_3$; more in general, the second sense-enable signal $SA_{enable2}$ is supplied on the enable inputs of the sense amplifiers that may be coupled to bit lines arranged downstream with respect to the equivalent nodes so as to bring about enabling thereof.

In greater detail, the second sense-enable signal $SA_{enable2}$ is generated by the second comparison circuit 35, which has a first input set at the comparison reference voltage $V_{rif\_comp}$. Moreover, the second comparison circuit 35 has a second input, which is connected to the gate terminal of the floating-gate transistor that forms the last memory cell of the dummy row 38.

Yet in greater detail, the second comparison circuit 35 generates the second sense-enable signal $SA_{enable2}$ as a function of the comparison reference voltage $V_{rif\_comp}$ and of the voltage present on the gate terminal of the floating-gate transistor that forms the last memory cell of the dummy row 38, so that the second sense-enable signal $SA_{enable2}$ represents the relation existing between these two signals.

In use, the second comparison circuit 35 detects overstepping, by the voltage present on the gate terminal of the floating-gate transistor that forms the last memory cell of the dummy row 38, of the comparison reference voltage $V_{rif\_comp}$. In particular, the second comparison circuit 35 generates the second sense-enable signal $SA_{enable2}$ so that, when the voltage present on the gate terminal of the floating-gate transistor that forms the last memory cell of the dummy row 38 exceeds the comparison reference voltage $V_{rif\_comp}$, the second sense-enable signal $SA_{enable2}$ enables operation of the sense amplifiers that may be coupled to bit lines BL coupled to the second portions of the rows of the memory array 2. For example, with reference to just the first, second, and third sense amplifiers $SA_1$, $SA_2$, $SA_3$, when the voltage present on the gate terminal of the floating-gate transistor that forms the last memory cell of the dummy row 38 exceeds the comparison reference voltage $V_{rif\_comp}$, just the third sense amplifier $SA_3$ is enabled.

In practice, given a row selected, the memory device 20 envisages reading of the data items stored in the first portion of this row selected as soon as the entire first portion is correctly pre-charged, without waiting for all the memory cells 3 of the row selected to be correctly pre-charged. The data items of the second portion of the row selected are read subsequently, when all the memory cells 3 of the row selected have been correctly pre-charged. In this way, the initial latency is markedly reduced.

This being said, to clarify the behaviour of the memory device 20, it is assumed that the delay due to the reading circuitry is 10 ns, and that it is desired to obtain an initial latency of 20 ns, as against 220 ns. It is moreover assumed that there apply the curves shown in FIG. 4, and that the comparison node $N_c$ is formed by the gate terminal of the first floating-gate transistor of the seventh set of dummy cells 23D. It is moreover assumed that the comparison node $N_c$ takes 20 ns to reach the comparison reference voltage $V_{rif\_comp}$, starting from when the dummy decoder 36 applies the row-biasing voltage to the dummy word line WLD. In addition, it is assumed that, as mentioned previously, each set of cells 23 is formed by two hundred cells, and thus that six sets of cells 23 comprise one thousand two hundred memory cells 3, i.e., 150 bytes.

This being said, after 30 ns, the memory device 20 makes available the digital output signals corresponding to the data items stored in the memory cells 3 of the first portion of the row selected. Consequently, after 30 ns the first 150 bytes are ready to be transmitted on a bus (not shown). On the hypothesis of transmitting at 200 MHz and with an output parallelism of eight, to transmit the first 150 bytes, 750 ns are necessary. Consequently, once transmission is through, also the second portion of the row selected is correctly pre-charged, and thus also the remaining data items, stored in the second portion of the row selected, are available and may be transmitted. Thus, the initial latency is equal to 30 ns. Moreover, recalling that the last memory cell 3 of the row selected is correctly pre-charged after 220 ns, we obtain that the minimum time of transmission of a single byte is 200 ns/150 bytes=1.33 ns; consequently, the maximum value admissible of transmission frequency is 750 MHz. In this case, it is found that, when the first 150 bytes have been transmitted, it is possible to start transmission of the bytes corresponding to the second portion of the row selected.

Figure 5:
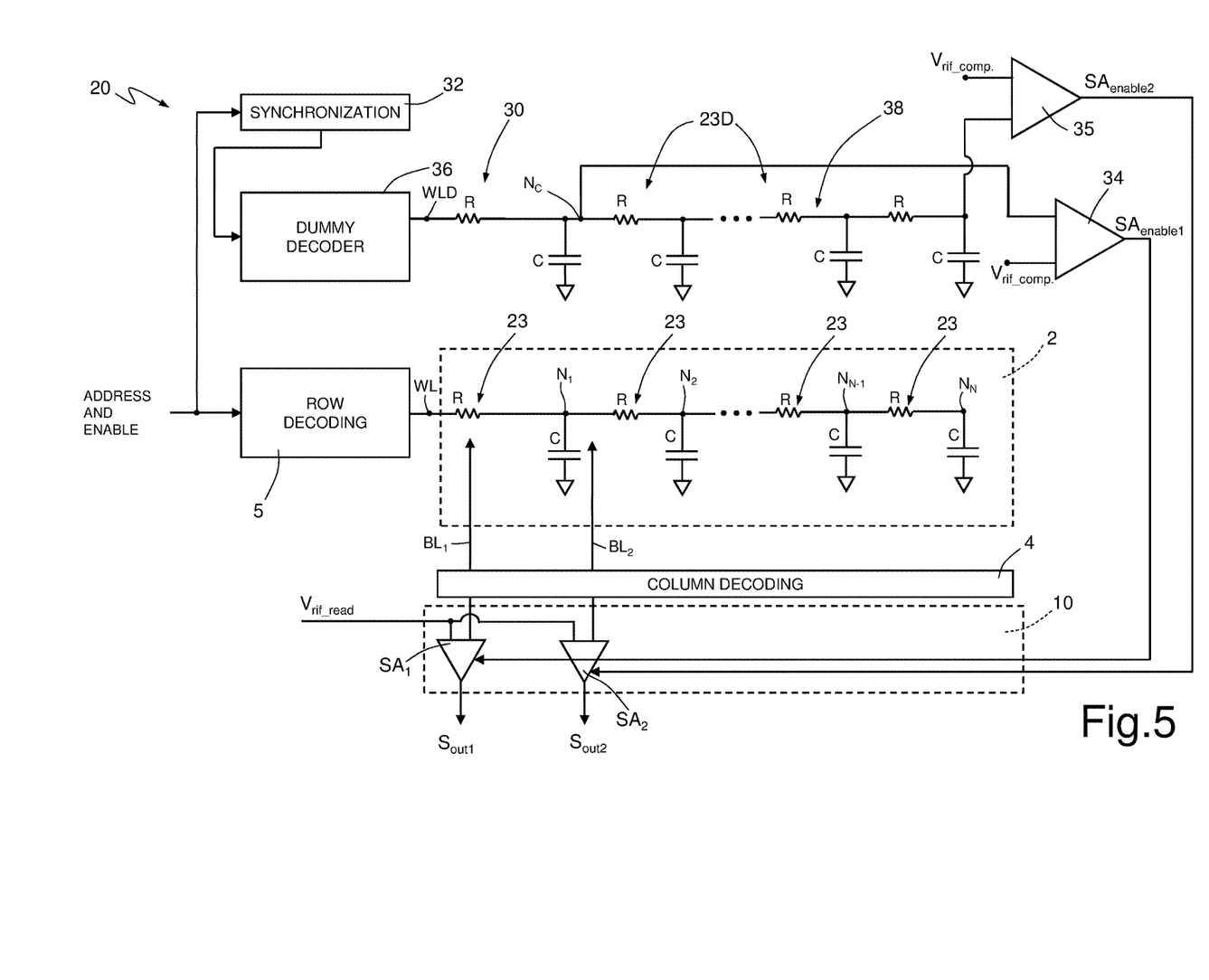

Once again with reference to the embodiment shown in FIG. 3, the corresponding structure may be better understood with reference to FIG. 5, where it is assumed that each set of cells 23 of the memory array 2 is formed by a single memory cell 3, as likewise each set of cells 23D of the dummy row 38. Consequently, the couplings shown in FIG. 5 between the RC elements and the other elements of the memory device 20 may be interpreted quantitatively because each RC element corresponds to a single memory cell 3. We thus have, for example, that the internal nodes $N_1$, $N_2$, $N_{N-1}$, $N_N$ coincide, respectively, with the gate terminals of the floating-gate transistors that form the first, second, (N−1)-th, and N-th memory cell 3 of the row of the memory array 2 shown in FIG. 5. Moreover, we have that the comparison node $N_c$ coincides with the gate terminal of the floating-gate transistor that forms the first memory cell of the dummy row 38. Again, the first and second sense amplifiers $SA_1$, $SA_2$ are adjacent and receive at input, respectively, the first and second sense-enable signals $SA_{enable1}$, $SA_{enable2}$. Moreover, the first and second bit lines $BL_1$, $BL_2$ are coupled, respectively, to the first and second memory cells 3 of each row of the memory array 2, these last couplings being shown qualitatively, the electrical equivalents of the conduction terminals of the floating-gate transistors not being shown. The third sense amplifier $SA_3$ is no longer represented.

According to a different embodiment (not shown), the number of memory cells 3 that form each row of the memory array 2 may be smaller than the one referred to previously; for example, this number may be two thousand and forty-eight. The memory device may thus form a so-called embedded memory. In this case, it is, for example, possible for the first and last memory cells 3 of each between the dummy row 38 and the rows of the memory array 2 to be pre-charged correctly after 2.07 ns and 3.6 ns, respectively. Thus, assuming again that each set of cells 23 is formed by two hundred memory cells 3 and assuming, for example, that the last memory cell of the seventh set of cells 23 coincides with the comparison node $N_c$ and is pre-charged correctly after 2.6 ns, it is possible to reduce the initial latency from 3.6 ns to 2.6 ns. This reduction of the initial latency, albeit limited in absolute value, is in any case important in relative terms.

Figure 6:
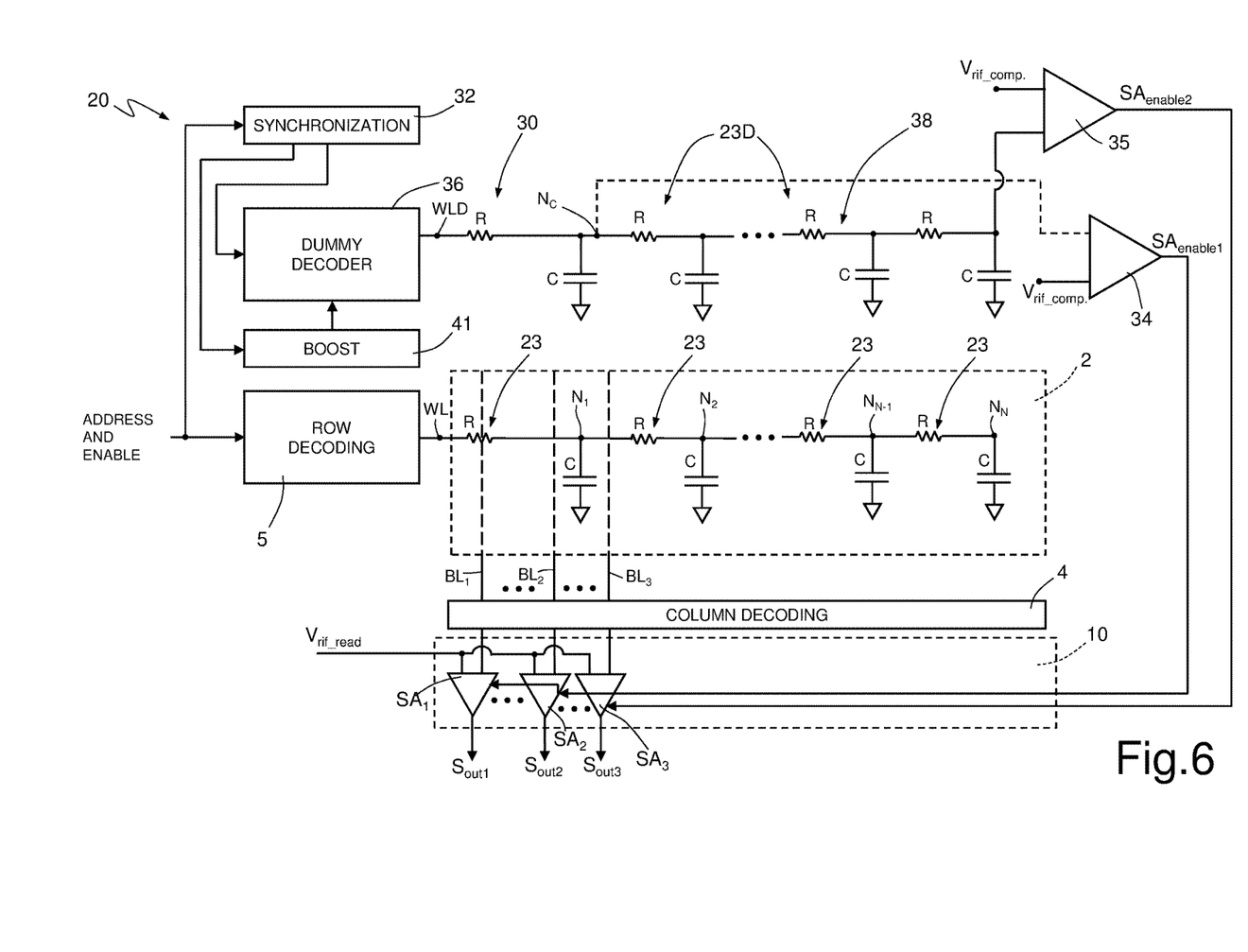

FIG. 6 shows a further embodiment, which differs from the embodiment shown in FIG. 3 in that it further comprises a boost circuit 41, of a per se known type. Without any loss of generality, it is moreover assumed that the number of memory cells 3 for each row is two thousand and forty-eight.

The boost circuit 41 is driven by the synchronisation circuit 32 in a way synchronous with the dummy decoder 36. Moreover, the boost circuit 41 is operatively coupled to the dummy decoder 36 and to the row-decoder circuit 5.

The boost circuit 41 includes a respective capacitor (not shown), which is charged before the read cycles, and is subsequently coupled to the dummy word line WLD and to the word line WL selected, when the dummy decoder 36 and the row-decoder circuit 5 start to pre-charge, so as to impose a fast variation of the row-biasing voltage.

In practice, the boost circuit 41 enables charging of both the dummy word line WLD and of each of the word lines WL in a faster way than what would occur in the absence of the boost circuit 41, without resorting to a row-decoder circuit having a lower resistance.

In general, the boost circuit 41 may be used also in the case of a high number of memory cells 3 per row.

The advantages of the solution proposed emerge clearly from the foregoing description. In particular, the present memory device enables reading of the data items set in an initial portion of each row as soon as the cells of this initial portion are correctly pre-charged, without waiting for the entire row to be correctly pre-charged, thus reducing the initial latency. In this connection, reading is not completely random; in fact, the data items set in the initial portion of each row exhibit a lower latency than the data items set in the subsequent portion.

This fact may be taken into consideration during storage of the data items.

Finally, it is clear that modifications and variations may be made to what has been described and illustrated herein, without thereby departing from the scope of the present invention, as defined in the annexed claims.

In particular, it is emphasized how the reading method implemented by the embodiments described previously may be applied also in the case of memory devices of a different type, such as the so-called PCMs. More in general, the present reading method may be implemented in all the memories with array arrangement of the cells, which inevitably suffer from propagation delays.

Moreover, it is possible for more than one comparison node to be present in the dummy row, all the comparison nodes being connected to a comparison stage, which generates sense-enable signals so that they indicate instants of time in which the comparison nodes reach the comparison reference voltage $V_{rif\_comp}$. In practice, in the presence of a number X of comparison nodes, each row of the memory array 2 is divided into X+1 consecutive portions. Given a row selected for reading, assuming an index "i" for indexing the first X portions of the row selected, the data items stored in the i-th portion are made available when i-th comparison node has reached the comparison reference voltage $V_{rif\_comp}$; the data items corresponding to the last portion are made available after the last cell of the row selected has been pre-charged. In this way, it is possible to reduce the initial latency even further.

Irrespective of the embodiment adopted, one or more cells of each row may contain bits corresponding to a check code, such as a parity-check code, for reducing any possible errors of reading of the proper data items.

What is claimed is:

1. A memory device comprising:
    a memory array that includes a plurality of memory cells arranged in rows and columns and a plurality of word lines and bit lines;
    a dummy structure comprising a dummy row of dummy cells and a dummy word line;
    a first pre-charging stage configured to bias, in a step of pre-charging of a read operation of the memory array, a word line of the memory array;
    an output stage comprising a plurality of sense amplifiers, each sense amplifier being couplable in an electrically controlled way to a corresponding bit line during the reading operation and configured to generate a corresponding output signal representing a data item stored in a corresponding memory cell coupled to the corresponding bit line and pre-charged by the first pre-charging stage; and
    a second pre-charging stage configured to bias the dummy word line simultaneously with the word line biased by the first pre-charging stage; and
    wherein the output stage further comprises a first sense-enable stage, which is configured to detect a state of complete pre-charging of a dummy cell intermediate between a first dummy cell and a last dummy cell of the dummy row; and
    wherein a first part of the sense amplifiers is configured to generate the corresponding output signals following upon sensing of the state of complete pre-charging of the intermediate dummy cell.

2. The memory device according to claim 1, wherein the output stage further comprises a second sense-enable stage, which is configured to detect a state of complete pre-charging of the last dummy cell of the dummy row, and wherein a second part of the sense amplifiers is configured to generate the corresponding output signals following upon sensing of the state of complete pre-charging of the last dummy cell of the dummy row.

3. The memory device according to claim 1, wherein the intermediate dummy cell has a respective position within the dummy row, and wherein the first part of the sense amplifiers may be coupled to bit lines coupled to memory cells that have positions, within the respective rows, comprised between a first position and the position of the intermediate dummy cell.

4. The memory device according to claim 3, wherein the output stage further comprises a second sense-enable stage, which is configured to detect a state of complete pre-charging of the last dummy cell of the dummy row, and wherein a second part of the sense amplifiers is configured to generate the corresponding output signals following upon sensing of the state of complete pre-charging of the last dummy cell of the dummy row.

5. The memory device according to claim 4, wherein the second part of the sense amplifiers are couplable to bit lines that are coupled to memory cells that have positions, within the respective rows, comprised between the position subsequent to the position of the intermediate dummy cell and the last position.

6. The memory device according to claim 1, further comprising a boost circuit of a capacitive type, which is configured to charge in a synchronous way the dummy row and the word line biased by the first pre-charging stage.

7. A method for reading a memory device
    wherein the memory device comprises:
        a memory array including a plurality of memory cells arranged in rows and columns and a plurality of word lines and bit lines;
        a dummy structure comprising a dummy row of dummy cells and a dummy word line;
        a pre-charging stage configured to bias, in a step of pre-charging of a read operation of the memory array, a word line of the memory array; and
        an output stage comprising a plurality of sense amplifiers, each sense amplifier being couplable in an electrically controlled way to a corresponding bit line during the reading operation and configured to generate a corresponding output signal representing a data item stored in a corresponding memory cell coupled to the corresponding bit line and pre-charged by the pre-charging stage; and
    wherein the method comprises:
        biasing the dummy word line simultaneously with the word line biased by the pre-charging stage;
        detecting a state of complete pre-charging of a dummy cell intermediate between a first dummy cell and a last dummy cell of the dummy row; and
        by a first part of the sense amplifiers, generating corresponding output signals following upon sensing of the state of complete pre-charging of the intermediate dummy cell.

8. The method according to claim 7, further comprising:
    detecting a state of complete pre-charging of the last dummy cell of the dummy row; and
    by a second part of the sense amplifiers, generating corresponding output signals following upon sensing of the state of complete pre-charging of the last dummy cell of the dummy row.

9. The method according to claim 7, wherein the intermediate dummy cell has a respective position within the dummy row, and wherein the first part of the sense amplifiers may be coupled to bit lines coupled to memory cells that have positions, within the respective rows, comprised between a first position and the position of the intermediate dummy cell.

10. The method according to claim 9, further comprising:
    detecting a state of complete pre-charging of the last dummy cell of the dummy row; and
    by a second part of the sense amplifiers, generating corresponding output signals following upon sensing of the state of complete pre-charging of the last dummy cell of the dummy row.

11. The method according to claim 10, wherein the second part of the sense amplifiers may be coupled to bit lines coupled to memory cells that have positions, within the respective rows, comprised between the position subsequent to the position of the intermediate dummy cell and the last position.

12. The method according to claim 7, further comprising synchronously charging the dummy row and the word line biased by the pre-charging stage, by a boost circuit of a capacitive type.

13. A memory device comprising:
- a memory array including an array of memory cells arranged in rows and columns, a plurality of word lines and a plurality of bit lines;
- a dummy structure comprising a dummy row of dummy cells and a dummy word line;
- a pre-charge circuit configured to pre-charge of a word line of the memory array and the dummy word line;
- a detection circuit configured to detect a state of complete pre-charging of an intermediate dummy cell between a first dummy cell and a last dummy cell of the dummy row; and
- an output stage comprising a plurality of sense amplifiers, each sense amplifier configured to generate a corresponding output signal representing a data item stored in a corresponding memory cell coupled to a corresponding bit line and pre-charged by the pre-charge circuit, wherein a first part of the sense amplifiers are configured to generate corresponding output signals following upon sensing of the state of complete pre-charging of the intermediate dummy cell.

14. The memory device according to claim 13, wherein the pre-charge circuit comprises:
- a first pre-charging stage configured to bias, in a step of pre-charging of a read operation of the memory array, the word line of the memory array; and
- a second pre-charging stage configured to bias the dummy word line simultaneously with the word line biased by the first pre-charging stage.

15. The memory device according to claim 13, wherein the output stage comprises a first sense-enable stage, which is configured to detect a state of complete pre-charging of the intermediate dummy cell.

16. The memory device according to claim 15, wherein the output stage further comprises a second sense-enable stage, which is configured to detect a state of complete pre-charging of the last dummy cell of the dummy row, and wherein a second part of the sense amplifiers is configured to generate corresponding output signals following upon sensing of the state of complete pre-charging of the last dummy cell of the dummy row.

17. The memory device according to claim 13, wherein the intermediate dummy cell has a respective position within the dummy row, and wherein the first part of the sense amplifiers are couplable to bit lines coupled to memory cells that have positions, within the respective rows, comprised between a first position and the position of the intermediate dummy cell.

18. The memory device according to claim 17, wherein the output stage is further configured to detect a state of complete pre-charging of the last dummy cell of the dummy row, and wherein a second part of the sense amplifiers is configured to generate corresponding output signals following upon sensing of the state of complete pre-charging of the last dummy cell of the dummy row.

19. The memory device according to claim 18, wherein the second part of the sense amplifiers are couplable to bit lines that are coupled to memory cells that have positions, within the respective rows, comprised between the position subsequent to the position of the intermediate dummy cell and the last position.

20. The memory device according to claim 13, further comprising a boost circuit of a capacitive type, which is configured to charge in a synchronous way the dummy row and the word line biased by the pre-charge circuit.

* * * * *